(12) United States Patent
Ma

(10) Patent No.: US 6,808,955 B2
(45) Date of Patent: Oct. 26, 2004

(54) METHOD OF FABRICATING AN INTEGRATED CIRCUIT THAT SEALS A MEMS DEVICE WITHIN A CAVITY

(75) Inventor: Qing Ma, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 23 days.

(21) Appl. No.: 10/005,667

(22) Filed: Nov. 2, 2001

(65) Prior Publication Data

US 2003/0087469 A1 May 8, 2003

(51) Int. Cl.[7] .............................................. H01L 21/66
(52) U.S. Cl. ........................... 438/51; 438/55; 438/64; 438/108; 438/456
(58) Field of Search .............................. 438/51, 50, 52, 438/53, 55, 64, 107, 108, 455, 456, 612, 613

(56) References Cited

U.S. PATENT DOCUMENTS

| | | | | |
|---|---|---|---|---|
| 5,721,162 A | * | 2/1998 | Schubert et al. | 438/52 |
| 5,837,562 A | * | 11/1998 | Cho | 438/51 |
| 5,866,469 A | * | 2/1999 | Hays | 438/456 |
| 6,297,072 B1 | * | 10/2001 | Tilmans et al. | 438/106 |
| 6,458,618 B1 | * | 10/2002 | Allen et al. | 438/53 |

FOREIGN PATENT DOCUMENTS

EP  1093-162 A1 * 4/2001 ........... H01L/23/04

* cited by examiner

*Primary Examiner*—Kevin M. Picardat
(74) *Attorney, Agent, or Firm*—Schwegman, Lundberg, Woessner & Kluth, P.A.

(57) ABSTRACT

A method of fabricating an integrated circuit that includes a microelectromechanical (MEMS) device. The method includes forming a MEMS device on a substrate and forming an integrated circuit. The method further includes coupling the substrate to the integrated circuit to form a sealed cavity that includes the MEMS device. The substrate and the integrated circuit are coupled together in a controlled environment to establish a controlled environment within the cavity where the MEMS device is located.

16 Claims, 5 Drawing Sheets

METHOD OF FABRICATING AN INTEGRATED CIRCUIT THAT SEALS A MEMS DEVICE WITHIN A CAVITY

FIELD OF THE INVENTION

The present invention relates to a method of fabricating an integrated circuit, and in particular to a method of fabricating an integrated circuit that includes a microelectromechanical systems (MEMS) device.

BACKGROUND OF THE INVENTION

A MEMS device is a microdevice that integrates mechanical and electrical elements on a common substrate using microfabrication technology. The electrical elements are formed using known integrated circuit fabrication technology. The mechanical elements are fabricated using lithographic processes that micromachine a substrate to selectively etch away portions of the substrate. Additional layers are often added to the substrate and then micromachined until the MEMS device is in a desired configuration. MEMS devices include actuators, sensors, switches, accelerometers and modulators.

A typical MEMS device relies on the mechanical oscillation of a suspended micron-sized beam. The beam is electrostatically deflected by energizing at least one actuation electrode. During operation of the MEMS device, the beam engages one or more electrical contacts to establish an electrical connection between isolated electrical elements.

The maximum frequency at which the beam can oscillate determines the highest possible speed of the MEMS device. Therefore, MEMS devices are vacuum packaged to minimize any air-damping that might reduce the beam's maximum oscillation frequency. Vacuum packaging also minimizes the adsorption of contaminants by the beam that might adversely effect the oscillating frequency of the beam.

MEMS devices are also packaged in other types of hermetic environments, such as moisture-free environments. Packaging MEMS devices in moisture-free environments enhances contact reliability by minimizing contact corrosion.

Vacuum and other hermetic MEMS packaging is expensive because it typically requires complicated alignment and bonding procedures that are difficult to apply to MEMS packaging. Once the MEMS devices are vacuum packaged, they are usually mounted onto a substrate with other electronic components as part of an integrated circuit. Mounting the MEMS devices separately from the other components that make up the integrated circuit places the MEMS devices a relatively long way from the other components. When there are large distances between components that make up an integrated circuit, the integrated circuit suffers from power dissipation and parasitic effects that are larger than necessary.

DETAILED DESCRIPTION OF THE INVENTION

The present invention relates to a method of fabricating an integrated circuit that includes a microelectromechanical systems (MEMS) device. The MEMS device can be a switch, relay or any other type of MEMS device.

In the following detailed description of the invention, reference is made to the accompanying drawings that show specific embodiments in which the invention may be practiced. These embodiments are described in sufficient detail to enable those skilled in the art to practice the invention. Other embodiments may be utilized and changes made without departing from the scope of the present invention. The following detailed description is not to be taken in a limiting sense, and the scope of the present invention is defined only by the appended claims.

Figure 1:
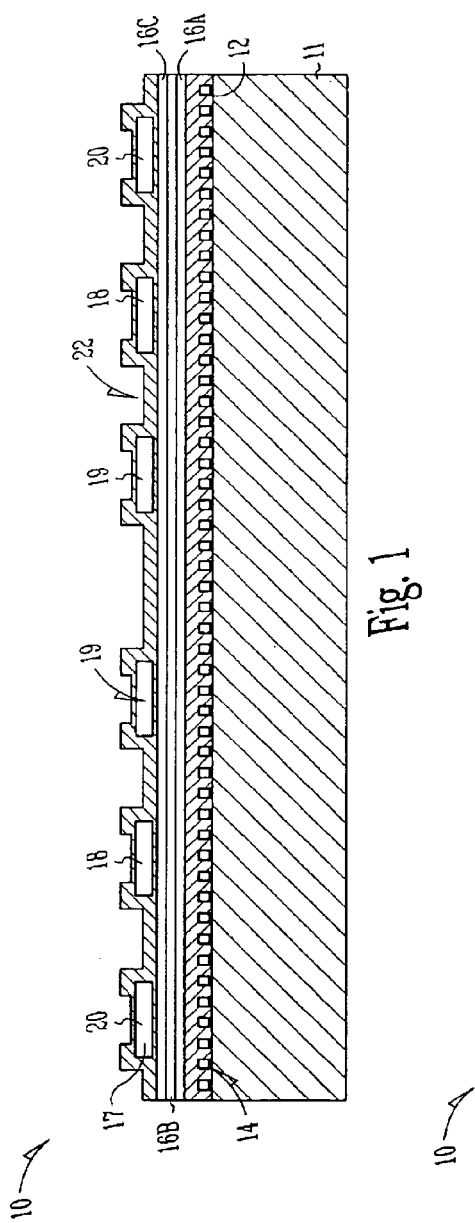
FIG. 1 is a schematic cross-sectional diagram of an integrated circuit.
Figure 2:
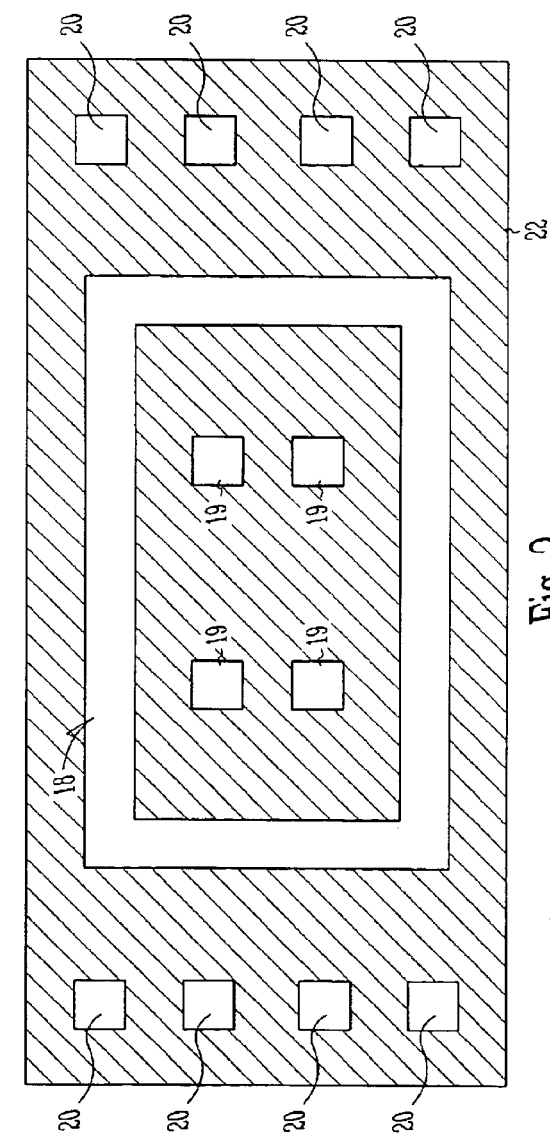
FIG. 2 is top view of the integrated circuit shown in FIG. 1.

As shown in FIGS. 1 and 2, the method of the present invention begins by providing an integrated circuit 10. The integrated circuit 10 includes a susbtrate 11 having an upper surface 12. The integrated circuit 10 may be a chip, printed circuit board, a motherboard, or any type of packaging element. In an example embodiment, the substrate 11 is a semiconductor wafer. A transistor layer 14, such as a CMOS transistor, is formed on the upper surface 12 of substrate 11. In an example embodiment, transistor layer 14 has a thickness less than 0.1 microns. The transistor layer 14 is at least partially covered by interconnect layers 16A, 16B, 16C. Although three interconnect layers 16A, 16B, 16C are shown in the FIG. 1, any number of interconnect layers may be used without departing from the scope of the present invention.

The interconnect layers 16A, 16B, 16C are covered with a layer of conductive material. The conductive layer is etched to form a closed ring 18 and pads 19 that are positioned within the ring 18. In an example embodiment, additional pads 20 are formed outside the ring 18.

Closed ring 18, pads 19, 20 and the exposed portion of upper interconnect layer 16C are covered with a passivation layer 22. In an example embodiment, passivation layer 22 is silicon nitride with a thickness ranging anywhere from 0.2 to 0.5 microns. The passivation layer 22 is etched to expose portions of ring 18 and pads 19, 20.

Figure 3:
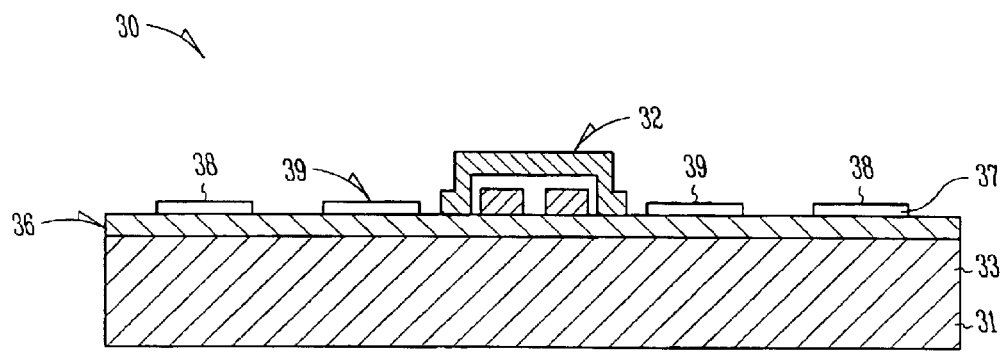
FIG. 3 is a schematic cross-sectional diagram of an assembly that includes a MEMS device mounted on a substrate.
Figure 4:
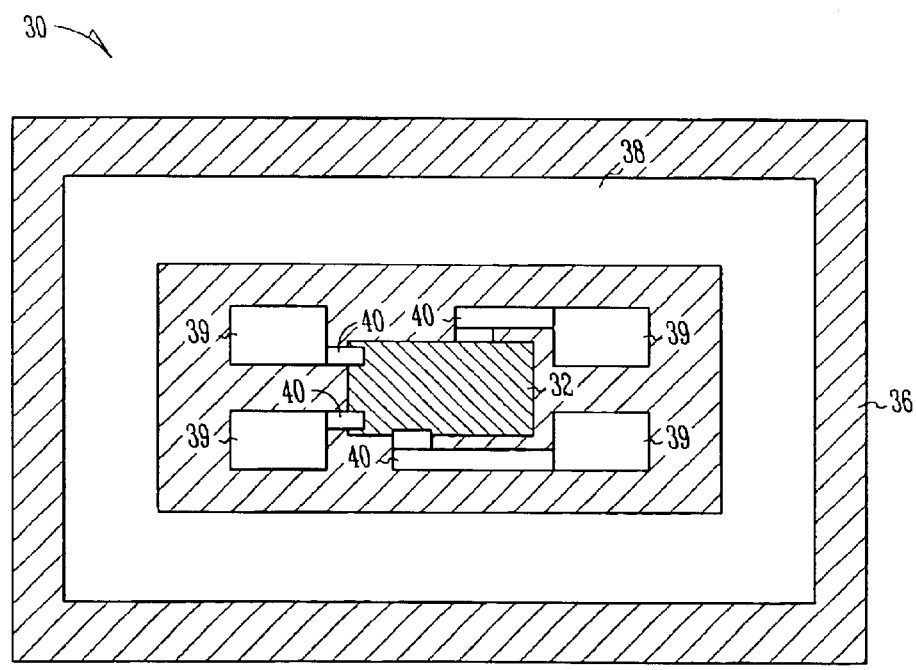
FIG. 4 is top view of the assembly shown in FIG. 3.

As shown in FIGS. 3 and 4, the method of the present invention further comprises forming an assembly 30 that includes any type of MEMS device 32 mounted onto a substrate 31. In the illustrated embodiment, a dielectric layer 36, such as silicon nitride or oxide, is layered onto an upper surface 33 of the substrate 31. The MEMS device 32 is formed on the dielectric layer 36.

The dielectric layer 36 is covered with a layer of conductive material. The conductive layer is etched to form a closed ring 38 and pads 39 that are positioned within the ring 38. In an example embodiment, the conductive layer is etched to form pathways 40 between each pad 39 and the MEMS device 32. Although four pads 39 are shown in the FIG. 4, any number of pads 39 may be used without departing from the scope of the present invention. In an example embodiment, a voltage source (not shown) is connected to one of the pads 39 in order to provide power to the MEMS device 32 and another of the pads 39 is connected to ground.

The selective etching that is performed in the method of the present invention may be done by using standard lithography techniques such as coating a layer with a layer of photoresist (not shown), exposing the photoresist layer with a pattern using photolithographic imaging of a patterned mask (not shown), etching the structure to form the pattern in the layer, and then removing the remaining photoresist.

Figure 5:
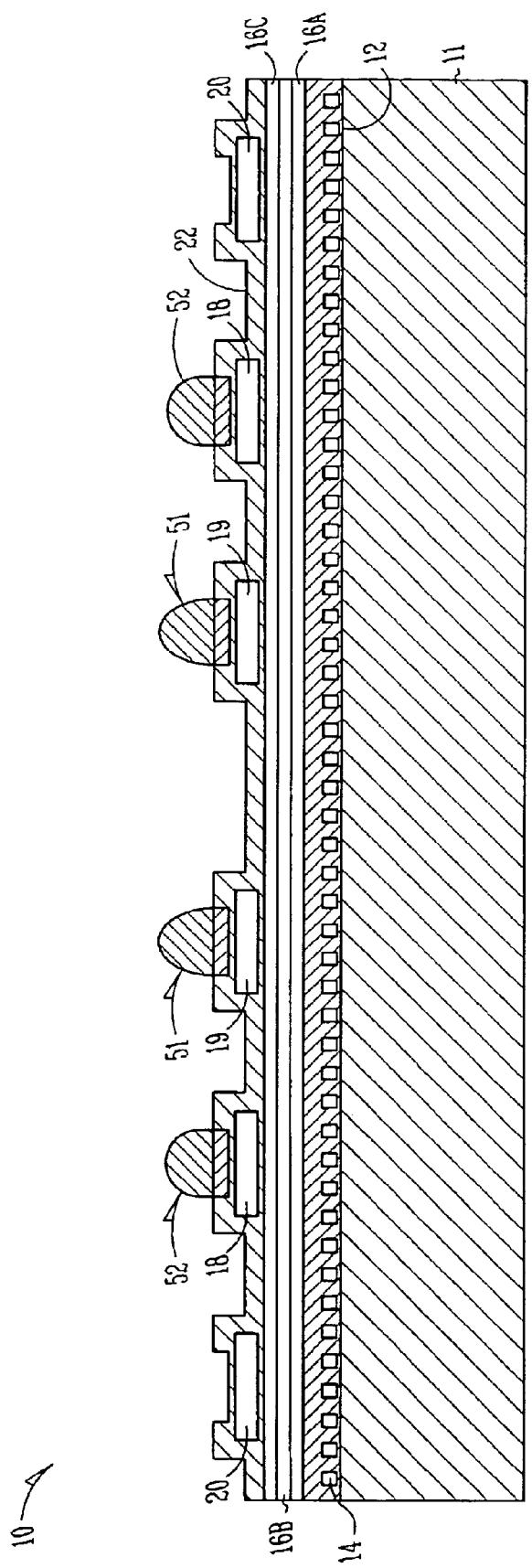
FIG. 5 is a schematic cross-sectional diagram of the integrated circuit shown in FIGS. 1 and 2 with a solder ring and solder balls placed onto the integrated circuit.

FIG. 5 shows preparing the integrated circuit 10 for coupling to the assembly 30. Solder is applied to ring 18 and bonding pads 19, 20 using under bump metallurgy techniques. The solder forms bumps 51 on pads 19, 20 and a ring 52 on ring 18. The solder ring 52 extends around the entire closed ring 18.

Figure 6:
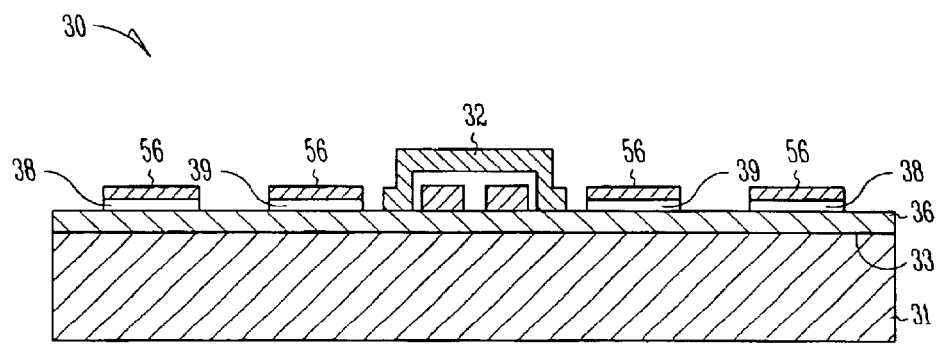
FIG. 6 is a schematic cross-sectional diagram of the assembly shown in FIGS. 3 and 4 with a solder ring and solder balls placed onto the substrate.

FIG. 6 shows an example embodiment where assembly 30 is prepared for coupling to integrated circuit 10. A wetting layer 56 is added to ring 38 and pads 39. Wetting layer 56 may be gold, nickel, titanium, or any other material that prevents solder diffusion and facilitates bonding assembly 30 to integrated circuit 10.

Figure 7:
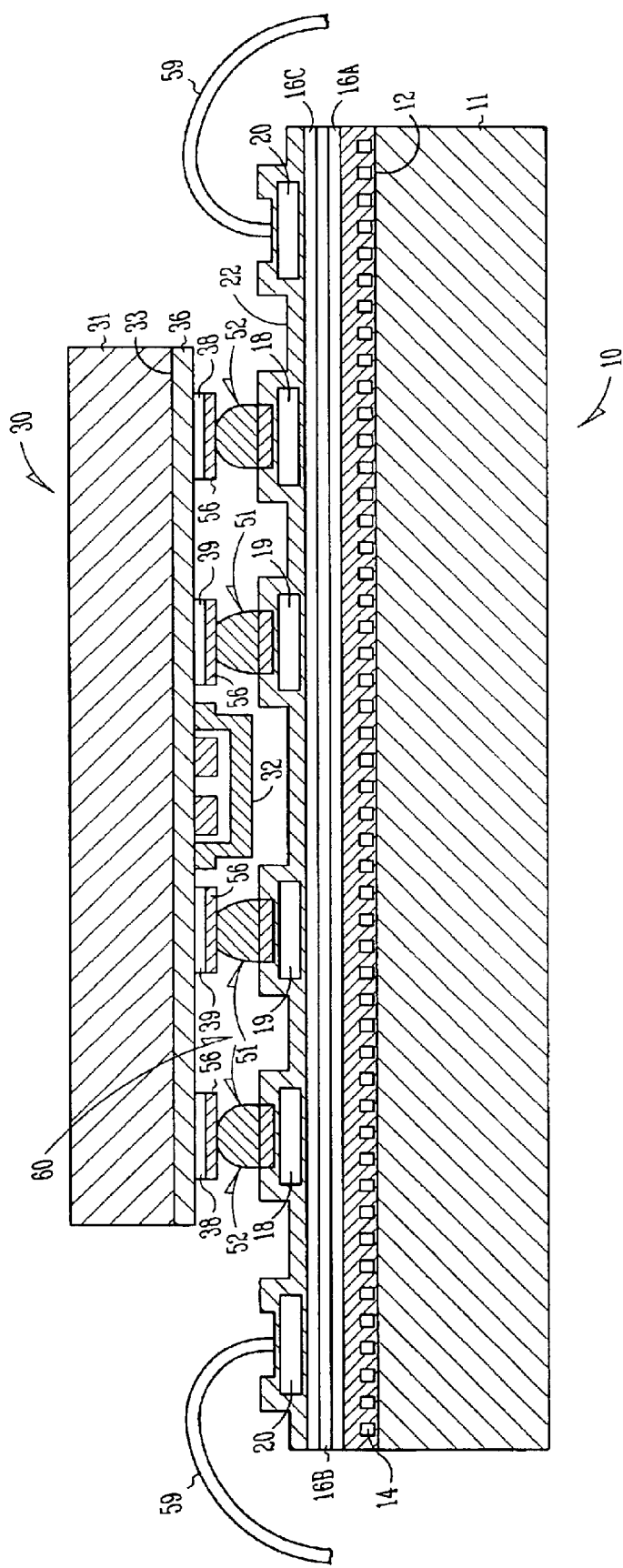
FIG. 7 is a schematic cross-sectional diagram of the assembly shown in FIG. 6 mounted onto the integrated circuit shown in FIG. 5.

As shown in FIG. 7, the method further includes coupling assembly 30 to integrated circuit 10. Integrated circuit 10 and assembly 30 are coupled together by flipping either integrated circuit 10 or assembly 30 over and overlaying the respective rings 38, 52. Ring 52 and ring 38 need to overlap around the entire circumference of the rings 38, 52 in order to form a sealed cavity 60 as the solder bonds the rings 38, 52 together. Once the rings 38, 52 are bonded together, the MEMS device 32 is positioned within the sealed cavity 60. Electrical signals may be transferred back and forth between MEMS device 32 and wires 59. In an example embodiment, the wires 59 are electrically connected to the MEMS device 32 via pads 20, interconnect layers 16A, 16B, 16C, pads 19, solder bumps 51 and pads 39. The present invention is not to be construed as limited to any particular method of coupling the integrated circuit 10 to the assembly 30, or any particular electrical connection between the MEMS device and other electrical components.

Integrated circuit 10 and assembly 30 are preferably bonded together within a controlled environment. Bonding integrated circuit 10 to assembly 30 within a controlled environment establishes the same controlled environment within cavity 60 as cavity 60 is formed. Therefore, MEMS device 32 will operate within a controlled environment of sealed cavity 60 even when MEMS device 32 is subsequently moved to uncontrolled environments.

In other example embodiments, the integrated circuit 10 and the assembly 30 are bonded together in a hermetic environment or a vacuum to form such environments within cavity 60. Operating the MEMS device 32 within a vacuum in the sealed cavity 60 allows any beams within the MEMS device 32 to perform at an optimum resonant frequency by eliminating air-damping that would effect beam oscillation. A vacuum within the cavity 60 would also prevent contaminants from adhering to the beam and altering the beam's resonant frequency.

The operations discussed above with respect to the described methods may be performed in a different order from those described herein. It should also be understood that the method of the present invention may be performed continuously.

The method of the present invention will allow manufacturers of electronic systems to improve product performance while reducing production costs. Integrating MEMS devices with other components that make up an integrated circuit provides increased performance while reducing circuit size. Decreasing the distances between the components that form the integrated circuit improves circuit performance by reducing power dissipation and parasitic effects within the integrated circuit.

Although specific embodiments have been illustrated and described herein, it will be appreciated by those of ordinary skill in the art that any arrangement which achieves the same purpose may be substituted for the embodiments shown. This application is intended to cover any adaptations or variations of the present invention. Therefore, it is manifestly intended that this invention be limited only by the claims and the equivalents thereof.

What is claimed is:

1. A method comprising:
   forming a MEMS device on a substrate;
   etching a conductive layer on the substrate to form a first ring layer and a first pad such that the MEMS device and the first pad are within the first ring layer;
   forming an integrated circuit; and
   bonding the first ring layer and the first pad to the integrated circuit to form a sealed cavity that includes the MEMS device and the first pad.

2. The method of claim 1, wherein forming the integrated circuit includes etching a conductive layer on the integrated circuit to form a second ring layer and a second pad such that the second pad is within the second ring layer.

3. The method of claim 2, wherein bonding the first ring layer and the first pad on the substrate to the integrated circuit includes bonding the first ring layer on the substrate to the second ring layer on the integrated circuit and bonding the first pad on the substrate to the second pad on the integrated circuit.

4. The method of claim 1, wherein etching a conductive layer on the substrate to form a first ring layer includes etching the conductive layer to form a first rectangular ring layer on the substrate.

5. The method of claim 1, wherein bonding the first ring layer and the first pad to the integrated circuit to form a sealed cavity includes bonding the first ring layer and the first pad to the integrated circuit in a controlled environment.

6. The method according to claim 5, wherein bonding the first ring layer and the first pad to the integrated circuit in a controlled environment includes bonding the first ring layer and the first pad to the integrated circuit in a vacuum.

7. A method comprising:
   forming a MEMS device on a substrate;
   etching a conductive layer on an integrated circuit to form a first ring layer and a first pad;
   bonding the first ring layer and the first pad to the substrate to form a sealed cavity that includes the MEMS device and the first pad, the first pad not mechanically engaging the MEMS device.

8. The method of claim 7, further comprising etching a conductive layer on the substrate to form a second ring layer and a second pad such that the MEMS device and the second pad are within the second ring layer.

9. The method of claim 8, wherein bonding the first ring layer and the first pad on the integrated circuit to the substrate includes bonding the second ring layer on the substrate to the first ring layer on the integrated circuit and bonding the second pad on the substrate to the first pad on the integrated circuit.

10. The method of claim 7, wherein etching a conductive layer on the integrated circuit to form a first ring layer includes etching the conductive layer to form a first rectangular ring layer on the integrated circuit.

11. The method of claim 7, wherein bonding the first ring layer and the first pad to the substrate to form a sealed cavity includes bonding the first ring layer and the first pad to the substrate in a controlled environment.

12. The method according to claim 11, wherein bonding the first ring layer and the first pad to the substrate in a controlled environment includes bonding the first ring layer and the first pad to the substrate in a vacuum.

13. A method comprising:

forming a MEMS device on a substrate;

etching a first conductive layer on the substrate to form a first ring layer and a first pad such that the MEMS device and the first pad are within the first ring layer;

forming an integrated circuit;

etching a second conductive layer on the integrated circuit to form a second ring layer and a second pad such that the second pad is within the second ring layer;

bonding the first pad on the substrate to the second pad on the integrated circuit; and bonding the first ring layer on the substrate to the second ring layer on the integrated circuit to form a sealed cavity that includes the MEMS device and the first and second pads.

14. The method of claim 13, wherein bonding the first ring layer on the substrate to the second ring layer on the integrated circuit includes coupling the substrate to the integrated circuit in a controlled environment.

15. The method according to claim 14, wherein coupling the substrate to the integrated circuit in a controlled environment includes coupling the substrate to the integrated circuit in a vacuum.

16. The method of claim 13, further comprising:

etching the first conductive layer to form at least one additional pad within the first ring layer;

etching the second conductive layer to form at least one additional pad within the second ring layer; and bonding the at least one additional pad on the substrate to the at least one additional pad on the integrated circuit within the sealed cavity.

* * * * *